United States Patent
Wang et al.

(10) Patent No.: US 12,255,387 B2
(45) Date of Patent: Mar. 18, 2025

(54) MOBILE ELECTRONIC DEVICE

(71) Applicant: Honor Device Co., Ltd., Shenzhen (CN)

(72) Inventors: Xuyang Wang, Shenzhen (CN); Hua Huang, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/016,836

(22) PCT Filed: Aug. 19, 2022

(86) PCT No.: PCT/CN2022/113505
§ 371 (c)(1),
(2) Date: Jan. 18, 2023

(87) PCT Pub. No.: WO2023/071450
PCT Pub. Date: May 4, 2023

(65) Prior Publication Data
US 2024/0250415 A1   Jul. 25, 2024

(30) Foreign Application Priority Data
Oct. 28, 2021   (CN) .......................... 202111264152.9

(51) Int. Cl.
*H01Q 1/38*       (2006.01)
*H01F 27/29*      (2006.01)
(Continued)

(52) U.S. Cl.
CPC ............... *H01Q 1/38* (2013.01); *H01F 27/29* (2013.01); *H02J 50/10* (2016.02); *H05K 1/028* (2013.01); *H05K 2201/10098* (2013.01)

(58) Field of Classification Search
None
See application file for complete search history.

(56) References Cited

U.S. PATENT DOCUMENTS 7,852,184 B2 * 12/2010 Yamazaki ............... H01F 38/14
336/84 M
8,169,286 B2 * 5/2012 Hasegawa ........... H01F 27/2871
336/200
(Continued)

FOREIGN PATENT DOCUMENTS

CN      204216621 U      3/2015
CN      204408794 U      6/2015
(Continued)

OTHER PUBLICATIONS

Translation_ISR (Year: 2022).*

*Primary Examiner* — Binh B Tran
*Assistant Examiner* — Muhammed Azam
(74) *Attorney, Agent, or Firm* — Leydig, Voit & Mayer, Ltd.

(57) ABSTRACT

An electronic device includes at least a housing, a mainboard, a conductive coil, and a conductive adapter. The housing includes an inner surface and an outer surface provided opposite to each other. The mainboard is arranged on the inner surface. The conductive coil is arranged on the inner surface and is integrally arranged with the housing. The conductive coil includes a winding portion, an outer connection terminal, and an inner connection terminal. In a radial direction of the winding portion, the mainboard is located at an outer side of the winding portion. The outer connection terminal is connected to the winding portion and is located at the outer side of the winding portion. The outer connection terminal is electrically connected to the mainboard.

16 Claims, 10 Drawing Sheets

(51) Int. Cl.
*H02J 50/10* (2016.01)
*H05K 1/02* (2006.01)

(56) References Cited

U.S. PATENT DOCUMENTS

| | | | | |
|---|---|---|---|---|
| 8,995,910 | B2 * | 3/2015 | Chong | H01F 27/38 |
| | | | | 455/41.1 |
| 9,105,967 | B2 * | 8/2015 | Park | H02J 50/10 |
| 9,484,767 | B2 * | 11/2016 | Yang | H02J 50/10 |
| 9,735,606 | B2 * | 8/2017 | Koyanagi | H02J 50/70 |
| 10,084,328 | B2 * | 9/2018 | You | H02J 50/80 |
| 10,097,245 | B2 * | 10/2018 | Kim | G06F 1/1626 |
| 10,263,467 | B2 | 4/2019 | Moon et al. | |
| 11,050,864 | B2 * | 6/2021 | Zhang | H04M 1/0277 |
| 2012/0274148 | A1 * | 11/2012 | Sung | H02J 50/12 |
| | | | | 307/104 |
| 2014/0247547 | A1 * | 9/2014 | Jung | H02J 50/70 |
| | | | | 361/679.26 |
| 2017/0178798 | A1 * | 6/2017 | Yoon | H01F 17/0013 |
| 2019/0086968 | A1 * | 3/2019 | Yun | G06K 19/07783 |
| 2021/0185843 | A1 * | 6/2021 | Lee | H01F 5/003 |
| 2021/0195739 | A1 * | 6/2021 | Bae | H05K 1/0224 |
| 2024/0007550 | A1 * | 1/2024 | Liu | H04M 1/0268 |
| 2024/0014541 | A1 * | 1/2024 | Li | H04B 5/72 |
| 2024/0204395 | A1 * | 6/2024 | Tian | H04M 1/026 |
| 2024/0205318 | A1 * | 6/2024 | Tian | H01M 50/247 |
| 2024/0250415 | A1 * | 7/2024 | Wang | H01F 27/2804 |
| 2024/0282511 | A1 * | 8/2024 | Huang | H01F 27/34 |

FOREIGN PATENT DOCUMENTS

| | | | | | |
|---|---|---|---|---|---|
| CN | 204732526 | U | | 10/2015 | |
| CN | 105119036 | A | | 12/2015 | |
| CN | 204967898 | U | | 1/2016 | |
| CN | 208112285 | U | | 11/2018 | |
| CN | 208112288 | U | | 11/2018 | |
| CN | 109004112 | A | | 12/2018 | |
| CN | 208861803 | U | | 5/2019 | |
| CN | 110364334 | A | | 10/2019 | |
| CN | 111818749 | A | | 10/2020 | |
| CN | 113453452 | A | * | 9/2021 | |
| CN | 114190022 | A | | 3/2022 | |
| CN | 114553986 | A | * | 5/2022 | ........... H04M 1/026 |
| CN | 115579228 | A | * | 1/2023 | |
| CN | 117135819 | A | * | 11/2023 | .......... H01R 12/714 |
| CN | 117395333 | A | * | 1/2024 | .......... G06F 1/1633 |
| CN | 117832820 | A | | 4/2024 | |
| KR | 20110127390 | A | | 11/2011 | |
| KR | 20110133813 | A | * | 12/2011 | |
| KR | 101177302 | B1 | * | 8/2012 | |
| KR | 20130062751 | A | * | 6/2013 | |
| KR | 20170009671 | A | * | 1/2017 | |
| KR | 20170037910 | A | * | 4/2017 | |
| WO | WO-2013048059 | A1 | * | 4/2013 | ............ H01F 27/36 |
| WO | 2021128076 | A1 | | 7/2021 | |

* cited by examiner

MOBILE ELECTRONIC DEVICE

CROSS-REFERENCE TO RELATED APPLICATIONS

This application is a national stage of International Application No. PCT/CN2022/113505, filed on Aug. 19, 2022, which claims priority to Chinese Patent Application No. 202111264152.9, filed on Oct. 28, 2021. The disclosures of both of the aforementioned applications are hereby incorporated by reference in their entireties.

TECHNICAL FIELD

Embodiments of this application relate to the field of terminal technologies, and in particular, to an electronic device.

BACKGROUND

With the explosive growth of electronic devices such as smartphones or tablet computers, electronic devices have more functions. For example, an electronic device has a wireless charging function or a near field communication (NFC) function. The wireless charging function allows the electronic device to be charged without being connected to a charging cable, so that a charging process of the electronic device is simple and convenient. The near field communication function allows users to pay or unlock a door using a mobile phone without taking out a physical card when taking public transportation or opening the door, thereby effectively improving convenience. In an electronic device, a corresponding conductive coil needs to be arranged to implement the wireless charging function or the near field communication function. In the related art, the conductive coil is formed by winding a copper wire. The electronic device includes a housing, a mainboard, and a mainboard bracket. The mainboard bracket is arranged between the mainboard and the housing. The conductive coil that is arranged separately needs to be bonded to the mainboard bracket, so as to be fastened. The conductive coil is electrically connected to the mainboard. A process of connecting the wire coil to the mainboard bracket is complex, the connection between the wire coil and the mainboard bracket has low reliability, which causes an adverse effect on normal use of the conductive coil.

SUMMARY

Embodiments of this application provide an electronic device, which can reduce the possibility that a conductive coil cannot be used normally due to low reliability of a connection between a wire coil and a mainboard bracket.

A first aspect of this application provides an electronic device. The electronic device includes at least a housing, a mainboard, a conductive coil, and a conductive adapter. The housing includes an inner surface and an outer surface provided opposite to each other. The mainboard is arranged on the inner surface. The conductive coil is arranged on the inner surface and is integrally arranged with the housing. The conductive coil includes a winding portion, an outer connection terminal, and an inner connection terminal. In a radial direction of the winding portion, the mainboard is located at an outer side of the winding portion. The outer connection terminal is connected to the winding portion and is located at the outer side of the winding portion. The outer connection terminal is electrically connected to the mainboard. The inner connection terminal is connected to the winding portion and is located on an inner side of the winding portion. The conductive adapter is electrically connected to the mainboard and the inner connection terminal.

The electronic device in the embodiments of this application includes a housing and a conductive coil that are integrally arranged. The conductive coil is directly connected to the housing, so that the conductive coil and the housing form an integral structure. The conductive coil and the housing are connected by a large force, and have high connection reliability. The conductive coil does not easily swing relative to the housing to be disconnected from the housing, which helps to reduce the possibility that the conductive coil cannot be used normally due to low reliability of a connection between a wire coil and a mainboard bracket. Because the conductive coil is connected to the housing so as to be fastened, the conductive coil does not need to be connected to the mainboard bracket or an auxiliary board bracket, so that there is no need to connect the conductive coil to the mainboard bracket or the auxiliary board bracket, and assembly processes are reduced.

In a possible implementation, a conductive layer is formed on the housing by using a conductive material, so that the conductive layer forms the conductive coil.

In a possible implementation, a conductive layer is formed on the housing by using a conductive material, and the conductive layer is patterned to form the conductive coil.

In a possible implementation, the conductive adapter is located on a side of the conductive coil facing away from the inner surface. By arranging the conductive adapter on the side of the conductive coil facing away from the inner surface of the housing, a complete conductive coil can be formed on the housing by using a conductive material in advance, so that the conductive coil is connected to the housing in all regions, thereby ensuring the connection between the conductive coil and the housing to be stable and reliable. The conductive adapter is then arranged on the side of the conductive coil facing away from the inner surface of the housing, to reduce the difficulty of arranging the conductive adapter.

In a possible implementation, the conductive coil has an increased thickness at the inner connection terminal. The thickness of the inner connection terminal is increased, so that a region of the inner connection terminal facing away from the inner surface of the housing can be higher than the winding portion. In this way, when the conductive adapter is connected to the region of the inner connection terminal facing away from the inner surface, a gap may be reserved between the conductive adapter and the winding portion, which helps to reduce the possibility of positional interference between the conductive adapter and the winding portion, and also helps to reduce the possibility of short-circuiting between the conductive adapter and the winding portion.

In a possible implementation, the conductive coil has an increased width at the inner connection terminal. The inner connection terminal is relatively wide, so that on one hand, the conductive adapter can be conveniently connected to the inner connection terminal, to reduce the possibility that the connection between the conductive adapter and the inner connection terminal is of great difficulty due to a small width of the inner connection terminal. On the other hand, the relatively large width of the inner connection terminal helps to increase a connection area between the conductive adapter and the inner connection terminal, thereby increasing a connection force between the conductive adapter and the inner connection terminal, and reducing the possibility of the conductive adapter and the inner connection terminal being separated from each other.

In a possible implementation, the housing includes a recess portion. The recess portion is provided on the inner surface of the housing. At least a part of the conductive coil is located in the recess portion. While the thickness of the conductive coil remains unchanged, a space occupied by the conductive coil can be reduced, thereby reducing an overall thickness of the electronic device; or, while the overall thickness of the electronic device remains unchanged, a thicker conductive coil can be arranged.

In a possible implementation, a shape of the conductive coil matches a shape of the recess portion.

In a possible implementation, the electronic device further includes an insulating protection layer. The insulating protection layer covers the winding portion. The insulating protection layer insulates and isolates the conductive adapter from the winding portion, to avoid short-circuiting by contact between the conductive adapter and the winding portion. The insulating protection layer can protect the winding portion to reduce the possibility of the winding portion being corroded, and can also improve the reliability of the conductive coil in an environment with high temperature and high humidity.

In a possible implementation, the mainboard includes a first elastic piece. The outer connection terminal includes a first contact. The first elastic piece is electrically connected to the first contact. The first elastic piece of the mainboard abuts against the first contact by pressing. Therefore, it is unnecessary to arrange an additional connector to connect the mainboard and the outer connection terminal, thereby helping to reduce components in use and the assembly difficulty, and save an inner space of the electronic device.

In a possible implementation, the mainboard includes a second elastic piece, the conductive adapter includes a second contact, and the second elastic piece is electrically connected to the second contact. The second elastic piece of the mainboard abuts against the second contact by pressing. Therefore, it is unnecessary to arrange an additional connector to connect the mainboard and the conductive adapter, which helps to reduce components in use and the assembly difficulty, and save an inner space of the electronic device.

In a possible implementation, the conductive adapter and the inner connection terminal are separate structures for assembly.

In a possible implementation, the conductive adapter and the inner connection terminal are boned or welded. After the conductive adapter and the inner connection terminal are bonded and welded together, the conductive adapter and the inner connection terminal are connected by a large force, helping to reduce the possibility of the conductive adapter and the inner connection terminal being disconnected from each other.

In a possible implementation, the conductive adapter is a flexible circuit board. The conductive adapter has good flexibility and can freely bend and deform, so that the inner space of the electronic device can be fully utilized, helping to improve the space utilization of the electronic device.

In a possible implementation, the conductive adapter and the conductive coil are of an integrally formed structure. The conductive coil and the conductive adapter are formed on the housing in advance by using a conductive material, so that the conductive adapter and the inner connection terminal do not need to be connected by means of bonding or welding. The conductive coil and the conductive adapter are fastened with high strength, and do not separate from each other easily. In addition, no assembly process is required, and connection by means of bonding or welding is not required.

In a possible implementation, the winding portion is spiral-shaped.

In a possible implementation, a material of the housing is selected from ceramic, metal, plastic, glass, or glass fiber.

In a possible implementation, the electronic device further includes a battery. The inner surface of the housing is arranged to face toward the battery. The winding portion is arranged corresponding to the battery. The conductive coil is directly arranged on the housing, which helps increase a gap between the conductive coil and the battery, thereby facilitating arrangement of heat dissipation fins between the conductive coil and the battery. Alternatively, the gap between the conductive coil and the battery can serve as a buffer space when the battery expands, helping to reduce the possibility that the conductive coil or the housing is squeezed when the battery expands.

DESCRIPTIONS OF NUMERALS

10. Electronic device; 20. Display component; 30. Housing; 31. Inner surface; 32. Outer surface; 33. Recess portion;

40. Mainboard; 41. First elastic piece; 42. Second elastic piece; 50. Electronic component; 60. Conductive coil; 61. Winding portion; 61a. Axis; 62. Outer connection terminal; 621. First contact; 63. Inner connection terminal; 64. Lead-out wire; 65. Conductive metal layer; 70. Conductive adapter; 71. Second contact; 80. Battery; 90. Insulating protection layer; 100. Bonding member; 200. Mainboard bracket; 300. Conductive coil; 400. Back adhesive piece; X. Thickness direction; Y. Height direction.

DESCRIPTION OF EMBODIMENTS

An electronic device in the embodiments of this application may be referred to as a user equipment (UE) or a terminal, or the like. For example, the electronic device may be a mobile terminal, such as a tablet computer, portable Android® device (PAD), a personal digital assistant (PDA), a handheld device having a wireless communication function, a computing device, a vehicle-mounted device, a wearable device, a virtual reality (VR) terminal device, an augmented reality (AR) terminal device, a wireless terminal in industrial control, a wireless terminal in self driving, a wireless terminal in remote medical, a wireless terminal in a smart grid, a wireless terminal in transportation safety, a wireless terminal in a smart city, or a wireless terminal in a smart home, or a fixed terminal. The forms of the terminal device are not limited in the embodiments of this application.

Figure 1:
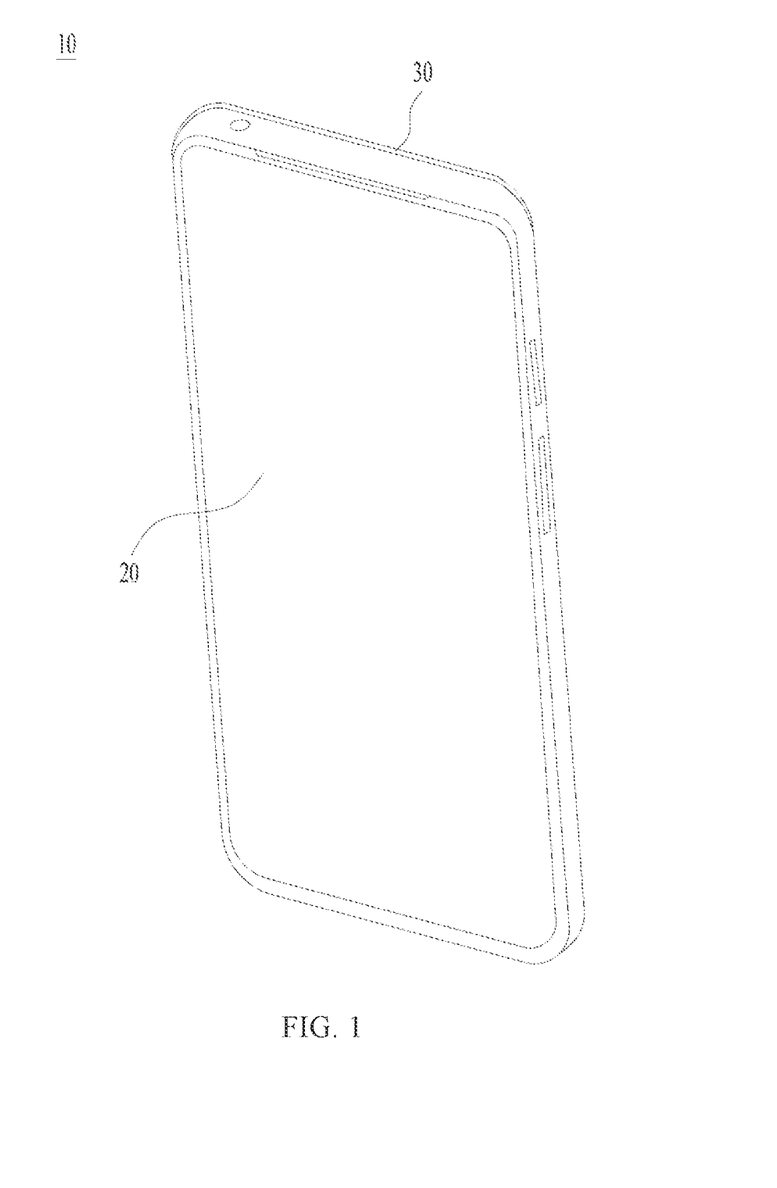
FIG. 1 is a schematic structural diagram of an electronic device.

In an embodiment of this application, FIG. 1 schematically shows a structure of an electronic device 10 according to an embodiment. As shown in FIG. 1, the electronic device 10 being a handheld device having a wireless communication function is used as an example for description. For example, the handheld device having a wireless communication function may be a mobile phone.

Figure 2:
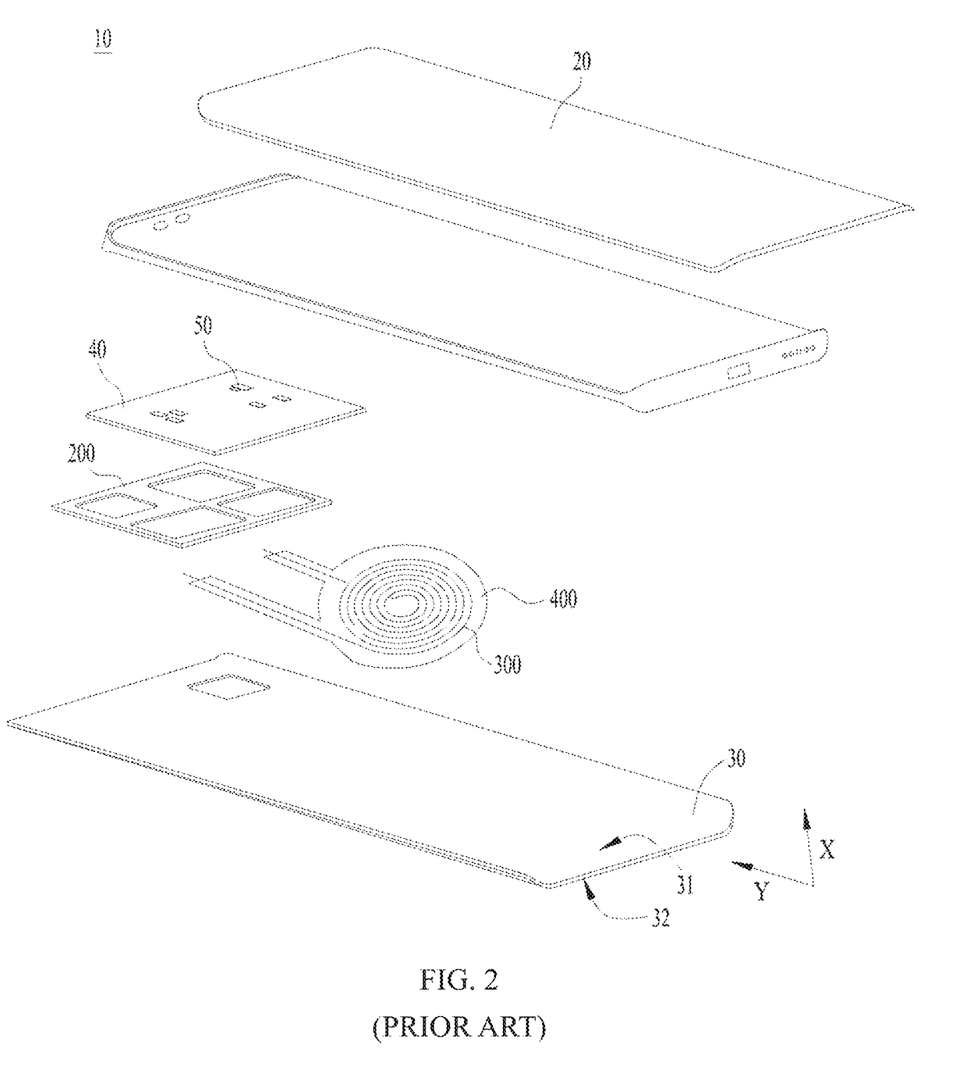
FIG. 2 is a schematic diagram of a partial exploded structure of an electronic device in the related art.

FIG. 2 schematically shows a partial exploded structure of the electronic device 10 in the related art. As shown in FIG. 2, the electronic device 10 includes a display component 20, a housing 30, a mainboard 40, and an electronic component 50.

The display component 20 has a display region that is used for displaying image information. The display component 20 is mounted on the housing 30, and the display region of the display component 20 is exposed, so that image information is presented to a user. The housing 30 includes an outer surface and an inner surface provided opposite to each other in a thickness direction thereof. A user can observe the outer surface of the housing 30 from outside of the electronic device 10. The mainboard 40 is arranged on the inner surface of the housing 30, so that the user cannot easily observe the mainboard 40 outside the electronic device 10.

The electronic component 50 is arranged on the mainboard 40. The mainboard 40 may be a printed circuit board (PCB). The electronic component 50 is welded to the mainboard 40 through a welding process. The electronic component 50 includes, but is not limited to, a central processing unit (CPU), an intelligent algorithm chip, or a power management integrated chip (PMIC).

The electronic device 10 further includes a mainboard bracket 200. The mainboard bracket 200 may be arranged between the housing 30 and the mainboard 40. The mainboard bracket 200 can support the mainboard 40. A material of the mainboard bracket 200 may be plastic.

The electronic device 10 further includes a conductive coil 300 and a back adhesive piece 400. The conductive coil 300 is electrically connected to the mainboard 40, thereby implementing data interaction between the conductive coil 300 and the mainboard 40. After the conductive coil 300 is arranged in the electronic device 10, corresponding functions can be implemented, for example, but not limited to, a wireless charging function and a near field communication function. The conductive coil 300 is a structural member that is arranged separately. The conductive coil 300 may be manufactured by winding a copper wire. To prevent the conductive coil 300 after the winding from rebounding under an action of an elastic restoring force and becoming loose, the conductive coil 300 is bonded on the back adhesive piece 400 so as to be fastened. When the conductive coil 300 is applied to the electronic device 10, the conductive coil 300 may be bonded to the mainboard bracket 200 through the back adhesive piece 400, so as to be fastened. Because a bonding area between the conductive coil 300 and the mainboard bracket 200 is relatively small, the conductive coil 300 and the mainboard bracket 200 are connected by a weak force and have low connection reliability. Therefore, the conductive coil 300 and the mainboard bracket 200 may be disconnected from each other, causing an adverse effect on the normal use of the conductive coil 300. For example, when the conductive coil 300 swings relative to the mainboard bracket 200 under an action of an external force, the conductive coil 300 easily disconnects from the mainboard bracket 200 and can swing freely.

The electronic device 10 further includes an auxiliary board bracket (not shown in the figure). In a height direction Y of the electronic device 10, the auxiliary board bracket and the mainboard bracket 200 are spaced apart. To improve the positional stability of the conductive coil 300, a part of the conductive coil 300 that is away from the mainboard bracket 200 may be bonded to the auxiliary board bracket through an insulating member and a bonding member. However, the insulating member and bonding member used for connecting the conductive coil 300 to the auxiliary board bracket occupy the inner space of the electronic device 10, and a process of connecting the conductive coil 300, the insulating member, the bonding member, and the auxiliary board bracket is complex and involves many assembly processes.

In addition, after the conductive coil 300 is bonded and fastened to the mainboard bracket 200 through the back adhesive piece 400, there is a gap between the conductive coil 300 and the housing 30. As a result, the conductive coil 300 occupies a large inner space. When the housing 30 is pressed by an external force to deform toward the conductive coil 300, the housing 30 presses the conductive coil 300, resulting in wear of the conductive coil 300, and causing an adverse effect on normal use of the conductive coil 300.

Figure 3:
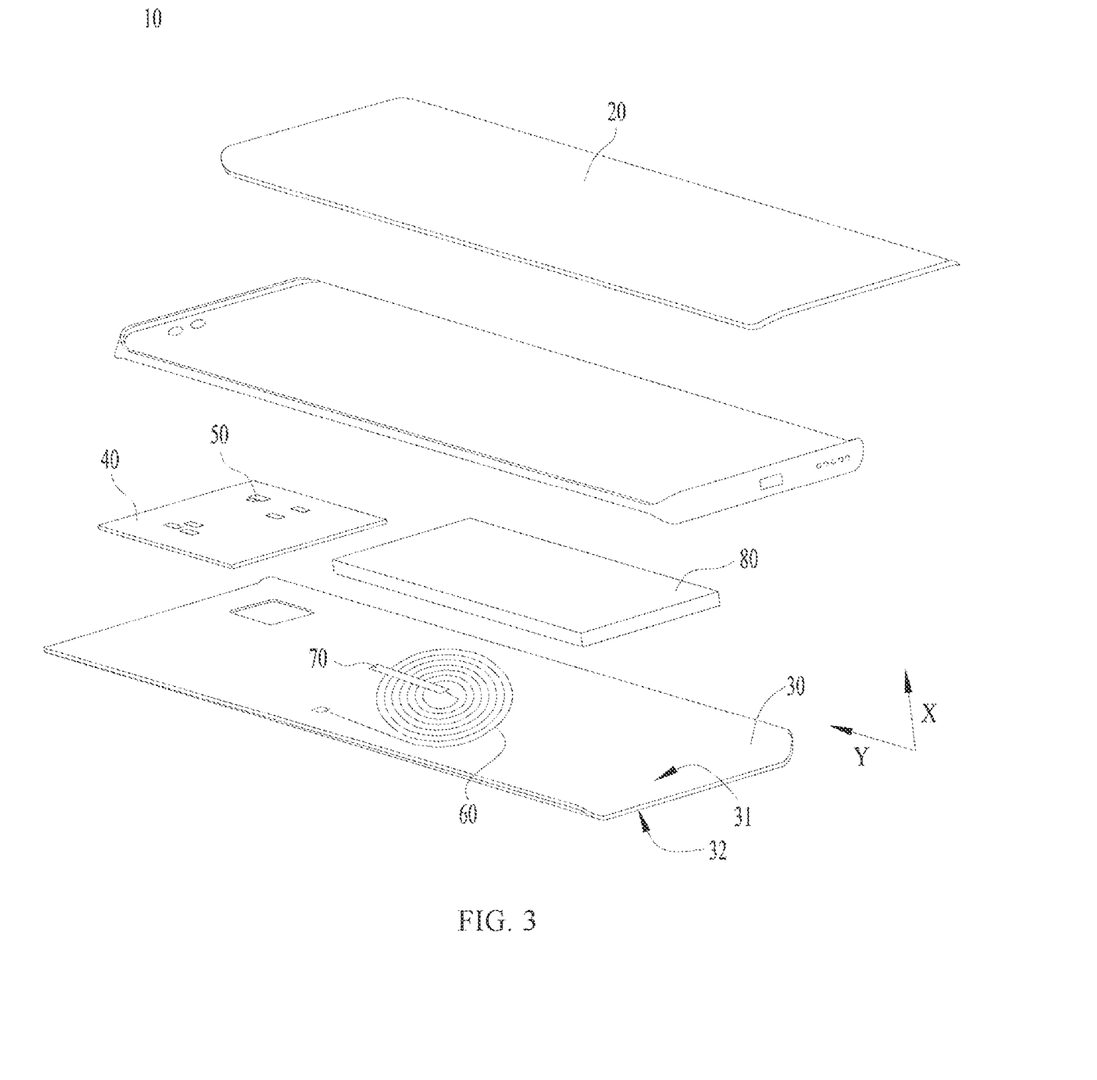
FIG. 3 is a schematic diagram of a partial exploded structure of an electronic device according to an embodiment of this application.
Figure 4:
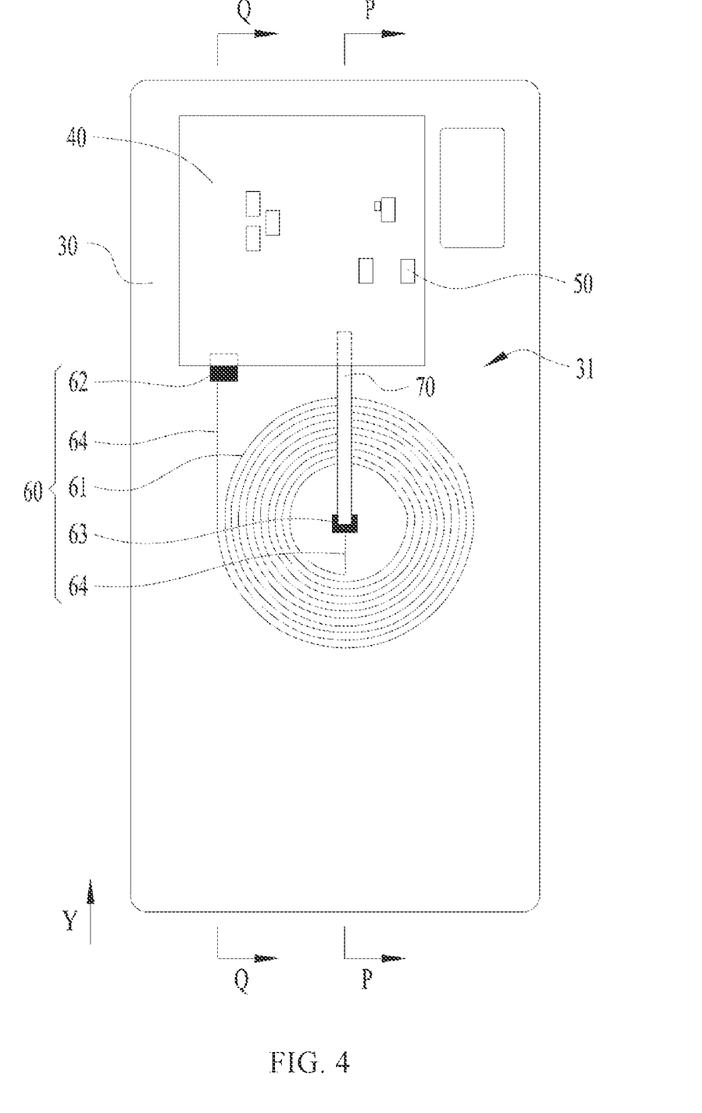
FIG. 4 is a schematic diagram of a connection structure of a housing, a conductive coil, and a mainboard of an electronic device according to an embodiment of this application.

FIG. 3 schematically shows a partial exploded structure of the electronic device 10 in an embodiment of this application. FIG. 4 schematically shows a connection structure of the housing 30, the conductive coil 60, and the mainboard 40 of the electronic device 10. As shown in FIG. 3 and FIG. 4, in the electronic device 10 provided in this embodiment of this application, the conductive coil 60 is arranged on the inner surface of the housing 30 and is integrally arranged with the housing 30, so that the conductive coil 60 and the housing 30 form an integral structure. The conductive coil 60 and the housing 30 are connected by a large force and have high connection reliability, so that the conductive coil 60 does not easily swing to disconnect from the housing 30. When the housing 30 is pressed, the conductive coil 60 and the housing 30 can deform simultaneously without causing mutual wear, so that the normal use of the conductive coil 60 is ensured.

An implementation of the electronic device 10 provided in the embodiments of this application is described below.

Figure 5:
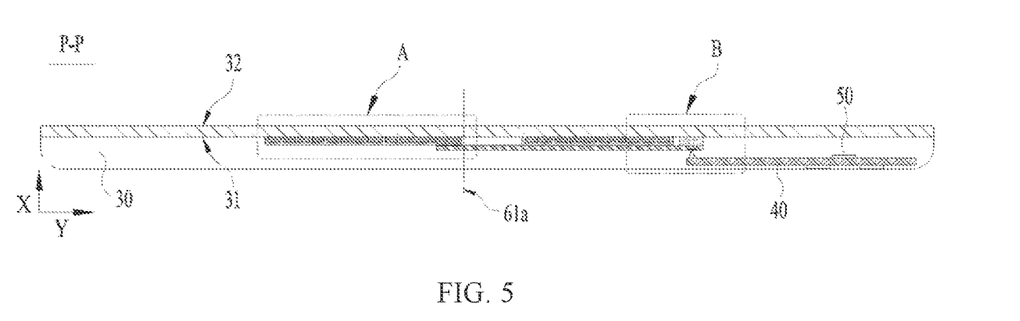
FIG. 5 is a schematic diagram of a cross-sectional structure in a P-P direction in FIG. 4.

FIG. 5 schematically shows a partial cross-sectional structure of the electronic device 10 in an embodiment. As shown in FIG. 3 to FIG. 5, the electronic device 10 in this embodiment of this application includes a housing 30, a mainboard 40, a conductive coil 60, and a conductive adapter 70. The housing 30 includes an inner surface 31 and an outer surface 32. In a thickness direction X of the housing 30, the inner surface 31 and the outer surface 32 are provided opposite to each other. The mainboard 40 is arranged on the inner surface 31 of the housing 30. The conductive coil 60 is arranged on the inner surface 31 of the housing 30. The conductive coil 60 is integrally arranged with the housing 30. It should be noted that, the integrated arrangement of the conductive coil 60 and the housing 30 means that the conductive coil 60 is directly processed and formed on the housing 30, so that the conductive coil 60 and the housing 30 form an integral structure, and there is no need to separately arrange a connector to connect and assemble the conductive coil 60 and the housing 30. The conductive coil 60 includes a winding portion 61, an outer connection terminal 62, and an inner connection terminal 63. The winding portion 61 is of a ring structure as a whole. The winding portion 61 has an axis 61a. In a radial direction of the winding portion 61, the mainboard 40 is located at an outer side of the winding portion 61. The outer connection terminal 62 is connected to the winding portion 61 and is located at the outer side of the winding portion 61. The radial direction of the winding portion 61 is perpendicular to the thickness direction X of the housing 30. The outer connection terminal 62 is electrically connected to the mainboard 40. The inner connection terminal 63 is connected to the winding portion 61 and is located on an inner side of the winding portion 61. The conductive adapter 70 is electrically connected to the mainboard 40 and the inner connection terminal 63. The conductive coil 60 is electrically connected to the mainboard 40, so that the conductive coil 60 can implement data interaction with the mainboard 40.

The electronic device 10 in this embodiment of this application includes a housing 30 and a conductive coil 60 that are integrally arranged. The conductive coil 60 is directly connected to the housing 30, so that the conductive coil 60 and the housing 30 form an integral structure. The conductive coil 60 and the housing 30 are connected by a large connection force and have high connection reliability, so that the conductive coil 60 does not easily swing to disconnect from the housing 30. In addition, when the housing 30 is pressed, the conductive coil 60 and the housing 30 can deform simultaneously, and the housing 30 does not press the conductive coil 60, thereby avoiding wear of the conductive coil 60. In this way, the normal use of the conductive coil 60 is ensured. A separate connector is not required to be arranged between the conductive coil 60 and the housing 30, and the conductive coil 60 does not need to be connected to the mainboard bracket or the auxiliary board bracket, thereby helping to reduce assembly processes. The conductive coil 60 is arranged on the inner surface of the housing 30, so that the conductive coil 60 occupies a smaller space in the electronic device 10, which helps to reduce an overall thickness of the electronic device 10.

The outer connection terminal 62 of the conductive coil 60 is located at the outer side of the winding portion 61, while the inner connection terminal 63 of the conductive coil 60 is located at the inner side of the winding portion 61. Because the conductive coil 60 is integrally arranged with the housing 30, the inner connection terminal 63 and the mainboard 40 are spaced apart by the winding portion 61. If a part of the mainboard 40 extends over the winding portion 61 in the height direction Y and is electrically connected to the inner connection terminal 63, the winding portion 61 and the mainboard 40 overlap with each other in the thickness direction X. Therefore, on one hand, a signal generated by the winding portion 61 may interfere with a signal of the mainboard 40 to affect the normal use of the mainboard 40. On the other hand, when the housing 30 is squeezed to deform, wear occurs between the conductive coil 60 and the mainboard 40, and a conductive element on the mainboard 40 may short-circuit the conductive coil 60 or the conductive coil 40 may short-circuit different electronic components 50 of the mainboard 40. In this application, the inner connection terminal 63 is led out through the conductive adapter 70 and connected to the mainboard 40, so that the mainboard 40 can be arranged on the outer side of the winding portion 61, which helps to reduce signal interference between the conductive coil 60 and the mainboard 40, or reduce the possibility of wear or short-circuiting between the conductive coil 60 and the mainboard 40 when the housing 30 is squeezed to deform, thereby improving the use safety and reliability of the electronic device 10.

In some possible implementations, the electronic device 10 further includes a battery 80. The inner surface 31 of the housing 30 is arranged to face toward the battery 80. The winding portion 61 is arranged corresponding to the battery 80. The battery 80 is configured to supply power for normal operation of the electronic device 10. Because the conductive coil 60 in this embodiment of this application is directly arranged on the housing 30, the gap between the conductive coil 60 and the battery 80 can be increased, to facilitate arrangement of heat dissipation fins between the conductive coil 60 and the battery 80. Or, the gap between the conductive coil 60 and the battery 80 can serve as a buffer space when the battery 80 expands, helping to reduce the possibility that the conductive coil 60 or the housing 30 is squeezed when the battery 80 expands. The conductive adapter 70 occupies a small space, so that the conductive adapter 70 can better utilize the space between the winding portion 61 and the battery 80 to electrically connect the inner connection terminal 63 and the mainboard 40, thereby helping to implement the electrical connection between the inner connection terminal 63 and the mainboard 40 in a case of a small overall thickness of the electronic device 10. In addition, the battery 80 does not easily deform when being squeezed by the conductive adapter 70, helping to ensure the safety of the battery 80 during use.

In some possible implementations, the winding portion 61 is spiral-shaped. The winding portion 61 spirals around the axis 61a. For example, the winding portion 61 may be of a rectangular spiral shape or a circular spiral shape. The winding portion 61 includes two or more turns of coils. A predetermined distance is maintained between two adjacent turns of coils. For example, when the conductive coil 60 is used for implementing the wireless charging function, to meet a requirement of the wireless charging function, the winding portion 61 may include seven turns of coils.

In some examples, there is a predetermined distance between the outer connection terminal 62 and an end portion of the winding portion 61. The conductive coil 60 includes a lead-out wire 64. The outer connection terminal 62 is connected to the winding portion 61 through the lead-out wire 64. There is a predetermined distance between the inner connection terminal 63 and the end portion of the winding portion 61. The inner connection terminal 63 is connected to the winding portion 61 through the lead-out wire 64.

In some possible implementations, a conductive layer having a predetermined pattern is formed on the housing 30 by using a conductive material. The conductive material is sprayed, coated, or electroplated on the housing 30 along a predetermined track, thereby forming a conductive layer with a predetermined pattern. The conductive layer forms the conductive coil 60. In other possible implementations, an integral conductive layer is formed on the housing 30 by using a conductive material. The conductive material is sprayed, coated, or electroplated on the housing 30, thereby forming an integral conductive layer. The integral conductive layer is patterned to form the conductive coil 60. For example, an integral conductive layer is etched by using an etching process or an integral conductive layer is cut by using a machining method, so that the conductive layer is patterned to form the conductive coil 60.

In some examples, the conductive material may be selected from gold, silver, copper, or copper alloy.

In other possible implementations, the conductive adapter 70 is located on a side of the conductive coil 60 facing away from the inner surface 31 of the housing 30. If the conductive coil 60 is located on the side of the conductive coil 60 facing the inner surface 31 of the housing 30, the conductive adapter 70 needs to be placed at a predetermined position on the housing 30 in advance. The conductive adapter 70 arranged in advance causes positional interference. Therefore, when the conductive coil 60 is formed on the housing 30 by using a conductive material, the conductive coil 60 is not directly connected to the housing 30 in a region where the conductive adapter 70 is arranged. On one hand, because a part of the conductive coil 60 needs to be arranged on the side of the conductive adapter 70 facing away from the housing 30, processing of the conductive coil 60 becomes complex. On the other hand, because the conductive coil 60 is not in direct contact with the housing 30 at the conductive adapter 70, a connection area between the conductive coil 60 and the housing 30 is reduced, and the connection force between the conductive coil 60 and the housing 30 is reduced. In this embodiment, by arranging the conductive adapter 70 on the side of the conductive coil 60 facing away from the inner surface 31 of the housing 30, the entire conductive coil 60 can be formed in advance on the housing 30 by using a conductive material, so that the conductive coil 60 is connected to the housing 30 in all regions, thereby ensuring the connection between the conductive coil 60 and the housing 30 to be stable and reliable. The conductive adapter 70 is then arranged from the side of the conductive coil 60 that faces away from the inner surface 31 of the housing 30, which helps to reduce the difficulty of arranging the conductive adapter 70.

In some possible implementations, as shown in FIG. 4, the conductive coil 60 has an increased width at the inner connection terminal 63. The inner connection terminal 63 is relatively wide, so that on one hand, the conductive adapter 70 can be conveniently connected to the inner connection terminal 63, to reduce the possibility that the connection between the conductive adapter 70 and the inner connection terminal 63 is of great difficulty due to a small width of the inner connection terminal 63. On the other hand, the relatively large width of the inner connection terminal 63 helps to increase a connection area between the conductive adapter 70 and the inner connection terminal 63, thereby increasing a connection force between the conductive adapter 70 and the inner connection terminal 63, and reducing the possibility of the conductive adapter 70 and the inner connection terminal 63 being separated from each other. In some examples, the width of the conductive adapter 70 is less than or equal to the width of the inner connection terminal 63.

In some possible implementations, as shown in FIG. 4, the conductive coil 60 has an increased width at the outer connection terminal 62. The outer connection terminal 62 is relatively wide, so that on one hand, the outer connection terminal 62 can be conveniently connected to the mainboard 40, to reduce the possibility that the connection between the outer connection terminal 62 and the mainboard 40 is of great difficulty due to a small width of the outer connection terminal 62. On the other hand, the relatively large width of the outer connection terminal 62 helps to increase a connection area between the outer connection terminal 62 and the mainboard 40, thereby increasing a connection force between the outer connection terminal 62 and the mainboard 40, and reducing the possibility of the outer connection terminal 62 and the mainboard 40 being separated from each other.

Figure 6:
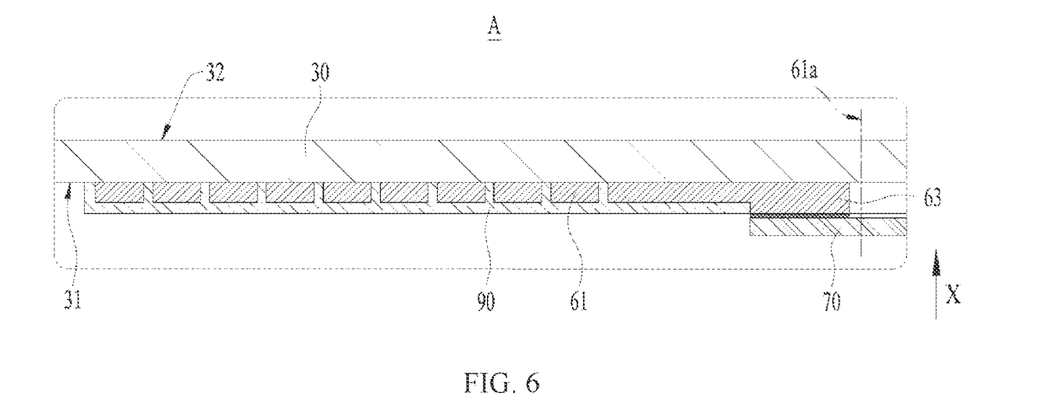
FIG. 6 is a schematic enlarged view of position A in FIG. 5.

In some possible implementations, as shown in FIG. 6, the conductive coil 60 has an increased at the inner connection terminal 63. A thickness direction of the conductive coil 60 is the same as the thickness direction X of the housing 30. The thickness direction X of the housing 30 is a direction from the inner surface 31 to the outer surface 32. Relative to the thickness of the winding portion 61, the thickness of the inner connection terminal 63 is larger, so that a region of the inner connection terminal 63 facing away from the inner surface 31 of the housing 30 can be higher than the winding portion 61. Therefore, when the conductive adapter 70 is connected to the region of the inner connection terminal 63 facing away from the inner surface 31, a gap may be reserved between the conductive adapter 70 and the winding portion 61, which reduces the possibility of positional interference between the conductive adapter 70 and the winding portion 61, and also helps to reduce the possibility of short-circuiting between the conductive adapter 70 and the winding portion 61. For example, a minimum thickness of the conductive coil 60 may range from 0.02 mm to 0.05 mm.

In some examples, the conductive coil 60 is of a flat structure. For example, a cross section of the conductive coil 60 is rectangular. A surface of the conductive coil 60 facing the housing 30 is a plane, so that a contact area between the conductive coil 60 and the housing 30 is relatively large, helping to improve the connection force between the conductive coil 60 and the housing 30 and improve the connection reliability and stability between the conductive coil 60 and the housing 30.

Figure 7:
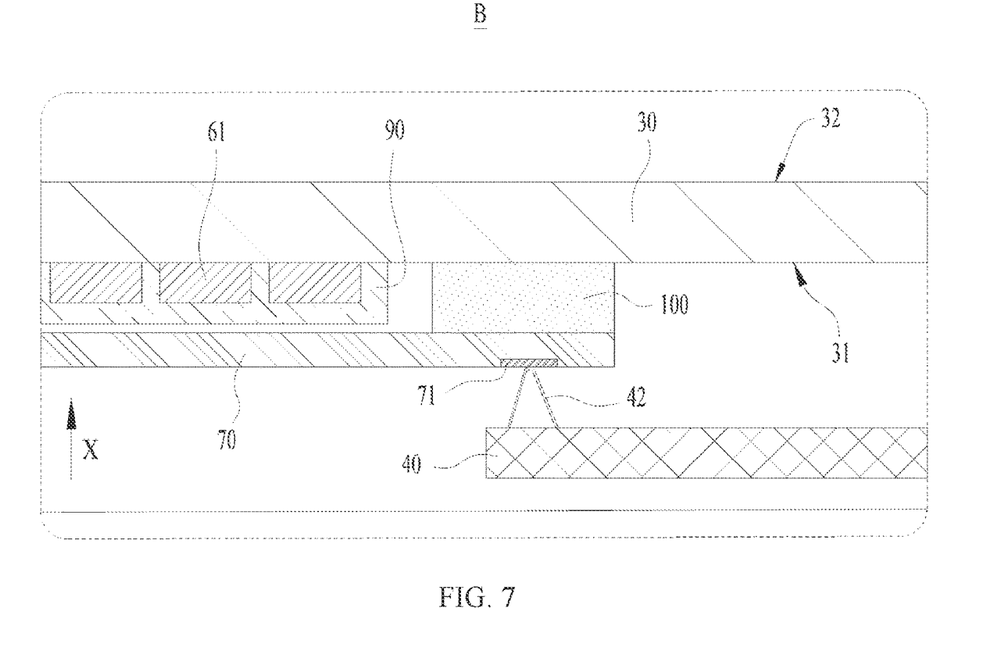
FIG. 7 is a schematic enlarged view of position B in FIG. 5.

In some possible implementations, as shown in FIG. 5 to FIG. 7, the electronic device 10 further includes an insulating protection layer 90. The insulating protection layer 90 covers the winding portion 61. On one hand, the insulating protection layer 90 insulates and isolates the conductive adapter 70 from the winding portion 61, to avoid short-circuiting by contact between the conductive adapter 70 and the winding portion 61. On the other hand, the insulating protection layer 90 can protect the winding portion 61 to reduce the possibility of the winding portion 61 being corroded, and can also improve the reliability of the conductive coil 60 in an environment with high temperature and high humidity. For example, a coating is formed on the outside of the conductive coil 60 by using a spraying process or a coating process. For example, the insulating protection layer 90 may be a ceramic coating. Alternatively, a coating is formed on the outside of the conductive coil 60 by using an ultraviolet curing process. For example, the insulating protection layer 90 may be a resin coating.

In some examples, the conductive adapter 70 is located on the side of the conductive coil 60 facing away from the inner surface 31 of the housing 30. The insulating protection layer 90 can insulate and isolate the winding portion 61 from the conductive adapter 70, thereby reducing the possibility of short-circuiting by contact between the conductive adapter 70 and the winding portion 61.

In some examples, the insulating protection layer 90 can cover at least a part of the conductive adapter 70 and the winding portion 61, thereby protecting both the conductive adapter 70 and the winding portion 61.

Figure 8:
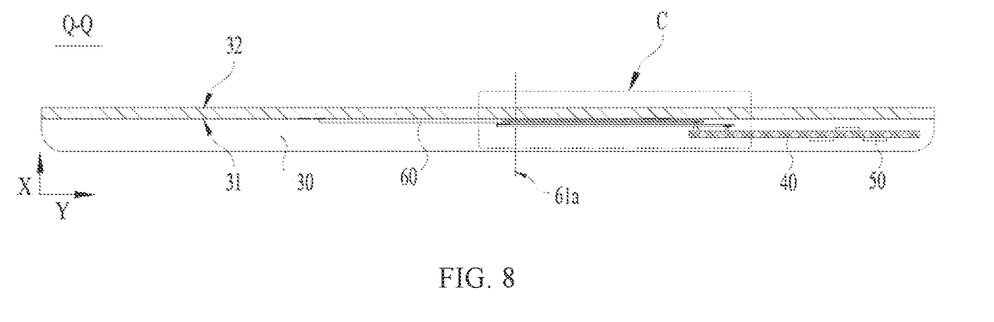
FIG. 8 is a schematic diagram of a cross-sectional structure in a Q-Q direction in FIG. 4.
Figure 9:
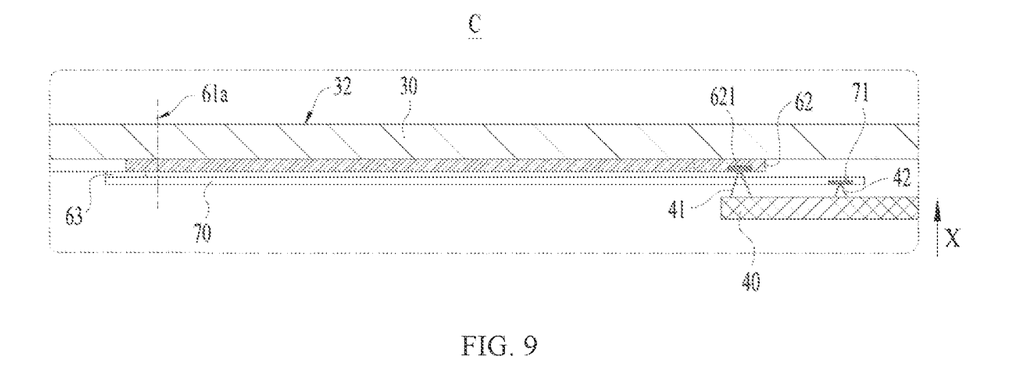
FIG. 9 is a schematic enlarged view of position C in FIG. 8.

In some possible implementations, FIG. 8 schematically shows a partial cross-sectional structure of the electronic device 10 in an embodiment. As shown in FIG. 8 and FIG. 9, the mainboard 40 includes a first elastic piece 41. The outer connection terminal 62 includes a first contact 621. The first elastic piece 41 is electrically connected to the first contact 621, thereby implementing an electrical connection between the outer connection terminal 62 and the mainboard 40. The first elastic piece 41 of the mainboard 40 abuts against the first contact 621 by pressing. Therefore, it is unnecessary to arrange an additional connector to connect the mainboard 40 and the conductive adapter 62, which helps to reduce components in use and the assembly difficulty, and save an inner space of the electronic device 10. For example, a material of the first elastic piece 41 may be copper, copper alloy, aluminum, or aluminum alloy.

In some possible implementations, a board-to-board (BTB) connector is arranged on each of the conductive adapter 70 and the mainboard 40. The conductive adapter 70 and the mainboard 40 are connected to each other through plugging between the two board-to-board connectors.

In other possible implementations, the mainboard 40 includes a second elastic piece 42. The conductive adapter 70 includes a second contact 71. The second elastic piece 42 is electrically connected to the second contact 71, thereby implementing an electrical connection between the conductive adapter 70 and the mainboard 40. The second elastic piece 42 of the mainboard 40 abuts against the first contact 71 by pressing. Therefore, it is unnecessary to arrange an additional connector to connect the mainboard 40 and the conductive adapter 70, which helps to reduce components in use and the assembly difficulty, and save an inner space of the electronic device 10. For example, a material of the second elastic piece 42 may be copper, copper alloy, aluminum, or aluminum alloy.

In some possible implementations, the conductive adapter 70 and the inner connection terminal 63 are separate structures for assembly. The conductive adapter 70 is an electronic component 50 manufactured separately. The conductive adapter 70 may be connected to the inner connection terminal 63 through assembly. For example, the conductive adapter 70 is connected to the inner connection terminal 63 through bonding. For example, the conductive adapter 70 and the inner connection terminal 63 are connected through bonding by using a conductive adhesive, ensuring that the conductive adapter 70 and the inner connection terminal 63 are mutually conductive, and ensuring the connection reliability between the conductive adapter 70 and the inner connection terminal 63. Alternatively, the conductive adapter 70 is connected to the inner connection terminal 63 through welding. The conductive adapter 70 and the inner connection terminal 63 may be made of a same material, so that after the conductive adapter 70 and the inner connection terminal 63 are welded to each other, the conductive adapter 70 and the inner connection terminal 63 are connected by a large force, helping to reduce the possibility of the conductive adapter 70 and the inner connection terminal 63 being disconnected from each other. In some examples, as shown in FIG. 7, a part of the conductive adapter 70 exceeding the winding portion 61 may be bonded to the inner surface 31 of the housing 30 through a bonding member 100 to ensure that a position is fixed and does not easily shift. The bonding member 100 may be a double-sided adhesive tape or an adhesive glue. In some examples, the conductive adapter 70 is a flexible printed circuit board (FPC). The conductive adapter 70 has good flexibility and can freely bend and deform, so that the inner space of the electronic device 10 can be fully utilized, helping to improve the space utilization of the electronic device 10. After the conductive coil 60 is formed on the housing 30, one end of the conductive adapter 70 can be connected to the inner connection terminal 63, and the other end can be connected to the mainboard 40. The inner connection terminal 63 is led out through the conductive adapter 70 and is electrically connected to the mainboard 40.

Figure 10:
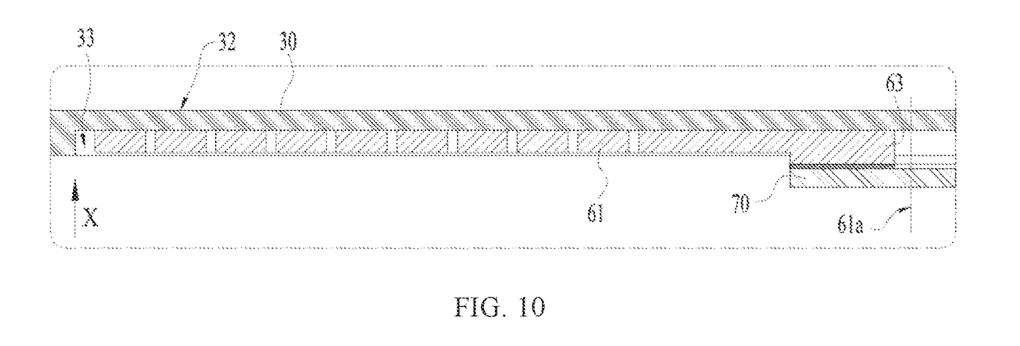
FIG. 10 is a schematic diagram of a partial cross-sectional structure of an electronic device according to another embodiment of this application.
Figure 11:
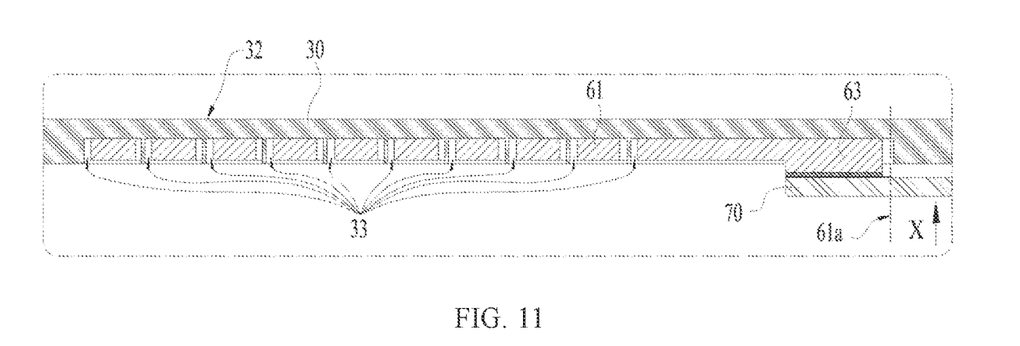
FIG. 11 is a schematic diagram of a partial cross-sectional structure of an electronic device according to another embodiment of this application.

In some possible implementations, FIG. 10 schematically shows a partial cross-sectional structure of the electronic device 10 in an embodiment. Referring to FIG. 10, the housing 30 includes a recess portion 33. The recess portion 33 is provided on the inner surface 31 of the housing 30. At least a part of the conductive coil 60 is located in the recess portion 33. While the thickness of the conductive coil 60 remains unchanged, a space occupied by the conductive coil 60 can be reduced, thereby reducing an overall thickness of the electronic device 10; or, while the overall thickness of the electronic device 10 remains unchanged, a thicker conductive coil 60 can be arranged. For example, a depth of the recess portion 33 is greater than or equal to the thickness of the conductive coil 60. The entire conductive coil 60 may be located in the recess portion 33. In some examples, there is one recess portion 33. The entire conductive coil 60 may be located on a bottom wall of the recess portion 33. In other examples, FIG. 11 schematically shows a partial cross-sectional structure of the electronic device 10 in an embodiment. Referring to FIG. 11, a shape of the recess portion 33 matches a shape of the conductive coil 60. The recess portion 33 extends along a predetermined track. A conductive material may be correspondingly arranged in a region of the recess portion 33 to form the conductive coil 60.

Figure 12:
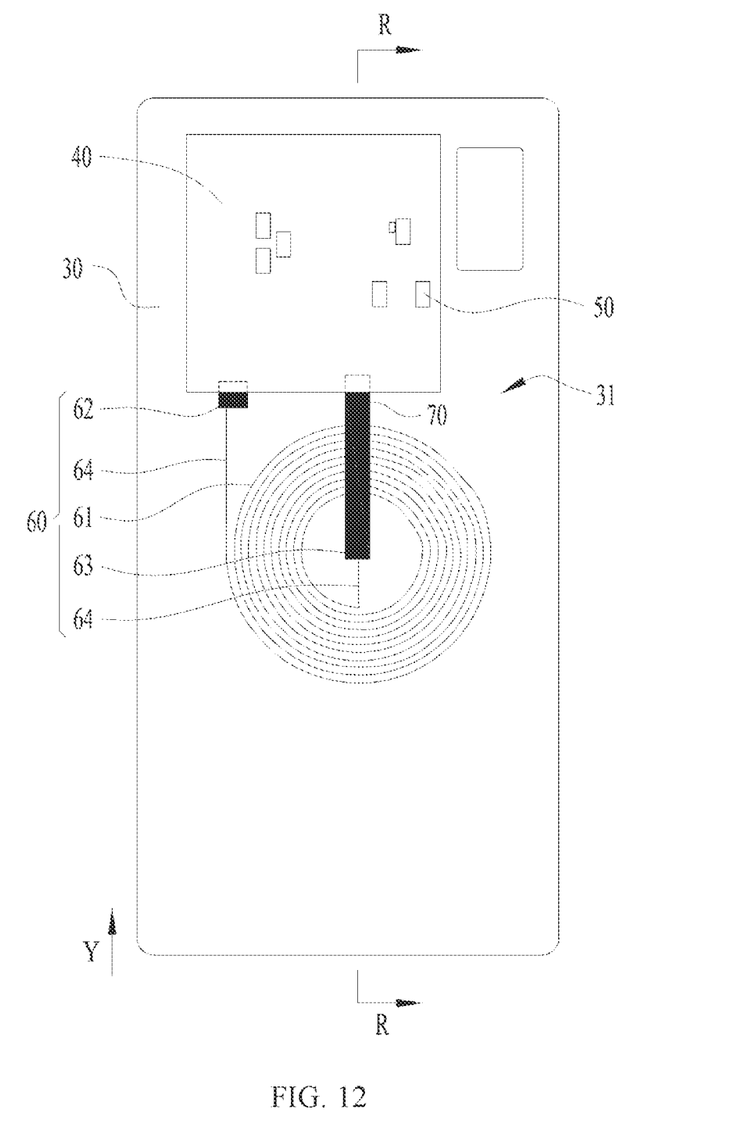
FIG. 12 is a schematic diagram of a connection structure of a housing, a conductive coil, and a mainboard of an electronic device according to another embodiment of this application.

In some possible implementations, FIG. 12 schematically shows a connection structure of the housing 30, the conductive coil 60, and the mainboard 40 of the electronic device 10. The structure of the electronic device 10 in the embodiment shown in FIG. 12 is the same as the structure of the electronic device 10 in the embodiment shown in FIG. 4 to FIG. 11. The same content is not repeated herein again, and the differences are mainly described herein. Referring to FIG. 12, the conductive adapter 70 is a metal conductive layer. With the inner connection terminal 63 as a starting point, the conductive material is formed into the conductive adapter 70 by using a coating process or an electroplating process. The material of the conductive adapter 70 and the material of the conductive coil 60 may be the same. The conductive coil 60 is formed on the housing 30 in advance by using conductive material, and then starting from the inner connection terminal 63, the conductive adapter 70 is formed by using the conductive material, so that the conductive adapter 70 and the inner connection terminal 63 do not need to be connected by means of bonding or welding. When the conductive adapter 70 and the inner connection terminal 63 are connected by welding, if a welding position shifts or a welding depth is relatively large, undesirable appearances of the housing 30 such as wrapping or deformation may occur. If the housing 30 is burnt through during welding, the housing 30 is scrapped. When the conductive adapter 70 and the inner connection terminal 63 are connected by bonding, selection of a bonding material or a bonding position affects the connection force between the conductive adapter 70 and the inner connection terminal 63. If the bonding material is improperly selected or the bonding position shifts, the connection force between the conductive adapter 70 and the inner connection terminal 63 may be weak, causing a deviation in the connection reliability between the conductive adapter 70 and the inner connection terminal 63, and separation easily occurs.

Figure 13:
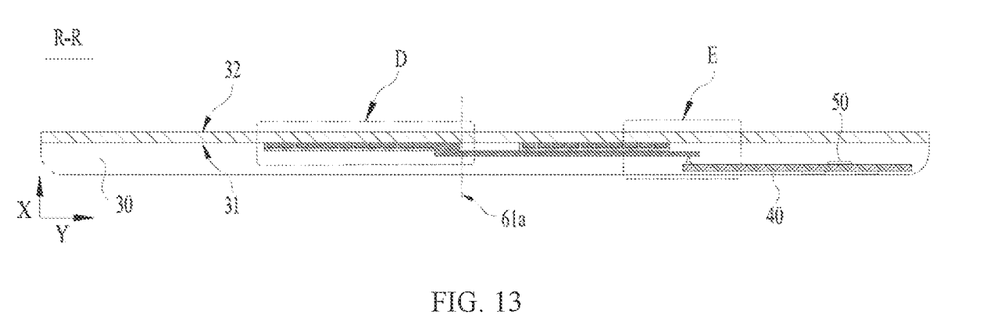
FIG. 13 is a schematic diagram of a cross-sectional structure in an R-R direction in FIG. 12.
Figure 14:
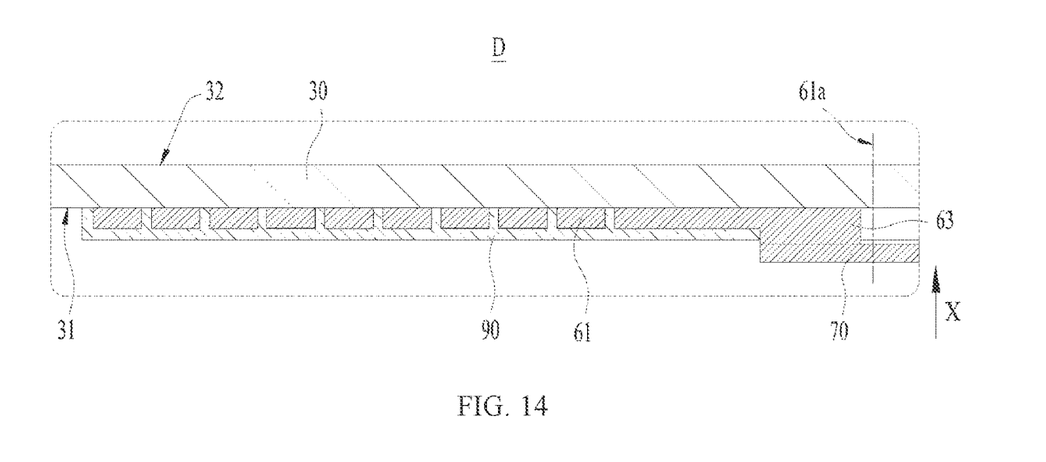
FIG. 14 is a schematic enlarged view of position D in FIG. 13.

In some examples, FIG. 13 schematically shows a partial cross-sectional structure of the electronic device 10 in an embodiment. Referring to FIG. 13 and FIG. 14, the conductive adapter 70 and the conductive coil 60 are of an integrally formed structure. The conductive adapter 70 and the inner connection terminal 63 are of an integrally formed structure, so that the two are firmly connected and are not prone to separation. In addition, no assembly process is required, and connection by means of bonding and welding is not required. The conductive coil 60 and conductive adapter 70 may be formed in one process by using a conductive material. There is a continuous transition between the conductive coil 60 and the conductive adapter 70. For example, with the outer connection terminal 62 as a starting position and an end portion, which is to be connected to the mainboard 40, of the conductive adapter 70 as an ending position, the conductive material is sprayed or coated from the starting position to the ending position along a predetermined track to form the conductive coil 60 and the conductive adapter 70.

Figure 15:
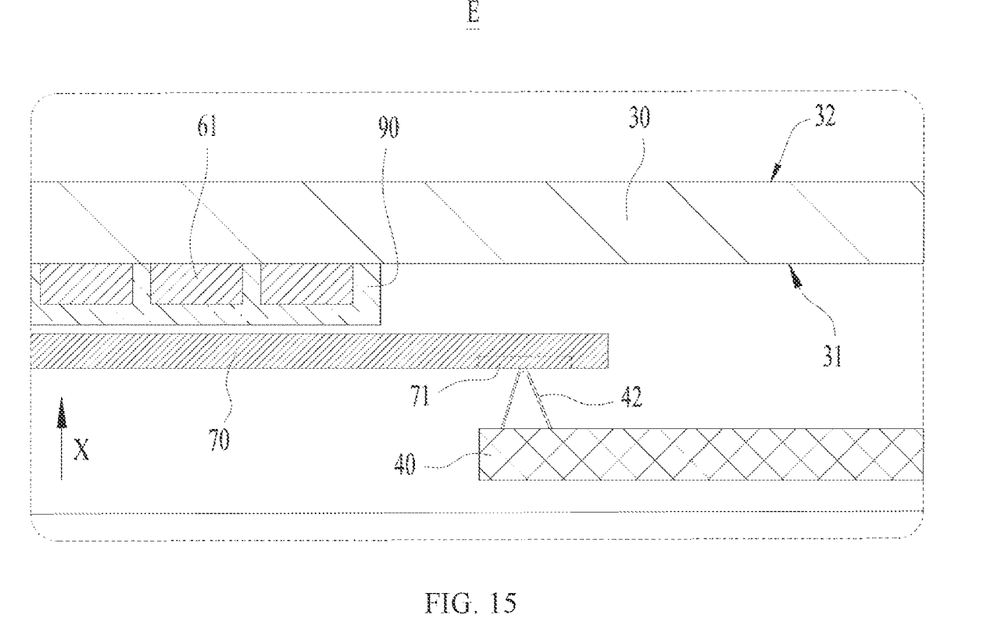
FIG. 15 is a schematic enlarged view of position E in FIG. 13.

In some examples, as shown in FIG. 15, the conductive adapter 70 includes a second contact 71. The mainboard 40 includes a second elastic piece 42. The second elastic piece 42 is pressed against the second contact 71 to implement the electrical connection between the conductive adapter 70 and the mainboard 40. Because the conductive adapter 70 is formed on the housing 30, the housing 30 with high rigidity may be used for bearing a resilience force of the second elastic piece 42. The housing 30 with high rigidity does not easily deform, which can reduce the possibility of the second elastic piece 42 and the second contact 71 being separated from each other due to deformation of the housing 30.

Figure 16:
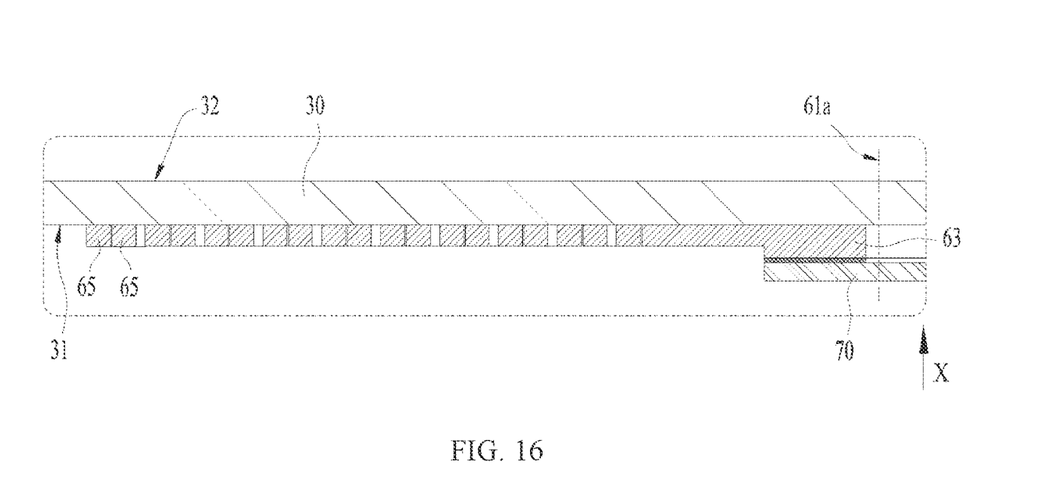
FIG. 16 is a schematic diagram of a cross-sectional structure of an electronic device according to still another embodiment of this application.

In some possible implementations, each turn of coil of the winding portion 61 may include a conductive metal layer. A conductive metal layer winds along a predetermined track to form the winding portion 61. In other possible implementations, as shown in FIG. 16, each turn of the coil of the winding portion 61 may include two winding conductive metal layers 65. The two conductive metal layers 65 are parallel to each other, and the two conductive metal layers 65 simultaneously wind along a predetermined track to form the winding portion 61. When the conductive coil 60 is used for implementing a wireless charging function, an arrangement in which each turn of coil includes two winding conductive metal layers 65 can help to reduce inductive resistance and improve the efficiency of wireless charging.

In some possible implementations, a material of the housing 30 may be selected from ceramic, metal, plastic, glass, or glass fiber.

In the description of the embodiments of this application, it should be noted that, unless otherwise explicitly specified and defined, the terms "mount", "connect", and "connection" should be understood in a broad sense, for example, fixed connection, indirect connection by a medium, or internal communication between two elements or an interaction relationship between the two elements. A person of ordinary skill in the art may understand the specific meanings of the foregoing terms in the embodiments of this application according to specific situations.

The embodiments of this application do not indicate or imply that the mentioned apparatus or element needs to have a particular direction and be constructed and operated in the particular direction, and therefore cannot be understood as a limitation on the embodiments of this application. In the description of the embodiments of this application, "plurality of" means two or more unless otherwise precisely and specifically described.

The terms such as "first", "second", "third", and "fourth" (if any) in the specification and claims of the embodiments of this application and in the accompanying drawings are used for distinguishing between similar objects and not necessarily used for describing any particular order or sequence. It should be understood that data used in this way is interchangeable in a suitable case, so that the embodiments of the embodiments of this application described herein can be implemented in a sequence in addition to the sequence shown or described herein.

Moreover, the terms "comprise," "comprise", and any other variants thereof are intended to cover the non-exclusive inclusion. For example, a process, method, system, product, or device that includes a list of steps or units is not necessarily limited to those expressly listed steps or units, but may include other steps or units not expressly listed or inherent to such a process, method, product, or device.

"Plurality of" in this specification means two or more. The term "and/or" used herein describes only an association relationship for describing associated objects and represents that three relationships may exist. For example, A and/or B may represent the following three cases: only A exists, both A and B exist, and only B exists. In addition, the character "/" in this specification generally indicates an "or" relationship between the associated objects. In formulas, the character "/" indicates a "division" relationship between the associated objects.

It may be understood that, various reference numerals in the embodiments of this application are merely for differentiation for ease of description, and are not intended to limit the scope of the embodiments of this application. It should be understood that in the embodiments of this application, an order of sequence numbers of the foregoing processes does not indicate an execution sequence, and execution sequences of the processes should be determined according to functions and internal logics thereof and should not impose any limitation on an implementation process of the embodiments of this application.

What is claimed is:
1. An electronic device, comprising:
a housing, comprising an inner surface and an outer surface provided opposite to each other;
a mainboard, arranged on the inner surface of the housing;
a conductive coil, arranged on the inner surface of the housing and integrally arranged with the housing, wherein the conductive coil comprises a winding portion, an outer connection terminal, and an inner connection terminal, wherein in a radial direction of the winding portion, the mainboard is located at an outer side of the winding portion, the outer connection terminal is connected to the winding portion and is located at the outer side of the winding portion, the outer connection terminal is electrically connected to the mainboard, and the inner connection terminal is con- nected to the winding portion and is located at an inner side of the winding portion; and a conductive adapter, wherein the conductive adapter is electrically connected to the mainboard and the inner connection terminal;

wherein the mainboard comprises a first elastic piece, the outer connection terminal comprises a first contact, and the first elastic piece is electrically connected to the first contact.

2. The electronic device according to claim 1, wherein a conductive layer is formed on the housing by using a conductive material; and wherein the conductive layer forms the conductive coil or the conductive layer is patterned to form the conductive coil.

3. The electronic device according to claim 1, wherein the conductive adapter is located on a side of the conductive coil facing away from the inner surface of the housing.

4. The electronic device according to claim 1, wherein the conductive coil has an increased thickness at the inner connection terminal.

5. The electronic device according to claim 1, wherein the conductive coil has an increased width at the inner connection terminal.

6. The electronic device according to claim 1, wherein the housing comprises a recess portion, the recess portion is provided on the inner surface, and at least a part of the conductive coil is located in the recess portion.

7. The electronic device according to claim 6, wherein a shape of the conductive coil matches a shape of the recess portion.

8. The electronic device according to claim 1, wherein the electronic device further comprises an insulating protection layer, wherein the insulating protection layer covers the winding portion.

9. The electronic device according to claim 1, wherein the mainboard comprises a second elastic piece, the conductive adapter comprises a second contact, and the second elastic piece is electrically connected to the second contact.

10. The electronic device according to claim 1, wherein the conductive adapter and the inner connection terminal are separate structures for assembly.

11. The electronic device according to claim 10, wherein the conductive adapter and the inner connection terminal are bonded or welded.

12. The electronic device according to claim 10, wherein the conductive adapter is a flexible circuit board.

13. The electronic device according to claim 1, wherein the conductive adapter and the conductive coil are of an integrally formed structure.

14. The electronic device according to claim 1, wherein the winding portion is spiral-shaped.

15. The electronic device according to claim 1, wherein a material of the housing is selected from ceramic, metal, plastic, glass, or glass fiber.

16. The electronic device according to claim 1, further comprising:

a battery, wherein the inner surface of the housing is arranged to face toward the battery, and the winding portion is arranged corresponding to the battery.

* * * * *